(12) United States Patent
Jackson (10) Patent No.: US 8,531,004 B1
(45) Date of Patent: Sep. 10, 2013

(54) METAL-ON PASSIVATION RESISTOR FOR CURRENT SENSING IN A CHIP-SCALE PACKAGE

(75) Inventor: Cameron Jackson, Los Gatos, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 13/523,792

(22) Filed: Jun. 14, 2012

(51) Int. Cl.
*H01L 29/00* (2006.01)

(52) U.S. Cl.
USPC ............ 257/536; 257/E27.047; 257/E27.114; 257/E23.054

(58) Field of Classification Search
USPC ............ 257/536, E27.047, E27.114, E23.054
See application file for complete search history.

(56) References Cited

U.S. PATENT DOCUMENTS

| | | | |
|---|---|---|---|
| 5,633,785 A * | 5/1997 | Parker et al. | 361/766 |
| 6,150,714 A * | 11/2000 | Andreycak et al. | 257/690 |
| 7,638,861 B2 | 12/2009 | Choi et al. | |
| 2004/0216303 A1 | 11/2004 | Berlin et al. | |
| 2009/0039869 A1 * | 2/2009 | Williams | 324/123 R |
| 2010/0073122 A1 * | 3/2010 | Le Neel et al. | 338/25 |
| 2010/0237467 A1 | 9/2010 | Dalton et al. | |
| 2011/0003432 A1 | 1/2011 | Noquil et al. | |

OTHER PUBLICATIONS

"Current Monitor and Accumulator with Integrated Sense Resistor," DS2741 Maxim Integrated Products Data Sheet, pp. 1-10.

* cited by examiner

*Primary Examiner* — Trung Q Dang
(74) *Attorney, Agent, or Firm* — Van Pelt, Yi & James LLP (57) ABSTRACT

A current sense resistor integrated with an integrated circuit die where the integrated circuit die is housed in a chip-scale semiconductor package includes a metal layer formed over a passivation layer of the integrated circuit die where the metal layer has an array of metal pillars extending therefrom. The metal pillars are to be electrically connected to a first conductive trace portion and a second conductive trace portion formed on a printed circuit board where the first conductive trace portion and the second conductive trace portion are electrically isolated from each other and physically separated by a separation of a first distance. The current sense resistor is formed in a portion of the metal layer spanning the separation between the first and second metal trace portions, the first and second conductive trace portions forming terminals of the current sense resistor.

12 Claims, 5 Drawing Sheets

METAL-ON PASSIVATION RESISTOR FOR CURRENT SENSING IN A CHIP-SCALE PACKAGE

CROSS-REFERENCE TO RELATED APPLICATIONS

This application is related to concurrently filed and commonly assigned U.S. patent application Ser. No. 13/523,787, entitled "Current Sensing Using a Metal-on-Passivation Layer on an Integrated Circuit Die," of the same inventor hereof, which application is incorporated herein by reference in its entirety.

FIELD OF THE INVENTION

The invention relates to current sensing devices and, in particular, to a current sensing resistor formed using a metal-on-passivation layer on an integrated circuit die.

DESCRIPTION OF THE RELATED ART

Current sense resistors are commonly used to sense or measure current flow in an electrical circuit. Current sense resistors sense current by measuring the voltage drop across the resistor where the current is then calculated based on Ohms's Law: $V=I*R$, where R denotes the resistance of the current sense resistor, V denotes the measured voltage across the sense resistor and I denotes the sensed current value.

Current sense resistors are often used with current monitor integrated circuits to measure current consumption in an electrical circuit, such as at a power supply. Most current monitor integrated circuits use an external current sense resistor to sense the current flow at the electrical node under test. That is, the current sense resistor is a discrete component external to the current monitor integrated circuit. In some cases, the current sense resistor may be integrated into the packaging of the current monitor integrated circuit.

SUMMARY OF THE INVENTION

According to one embodiment of the present invention, a current sense resistor integrated with an integrated circuit die where the integrated circuit die is housed in a chip-scale semiconductor package includes a metal layer formed over a passivation layer of the integrated circuit die where the metal layer has an array of metal pillars extending therefrom. The metal pillars are to be electrically connected to a first conductive trace portion and a second conductive trace portion formed on a printed circuit board where the first conductive trace portion and the second conductive trace portion are electrically isolated from each other and physically separated by a separation of a first distance. The current sense resistor is formed in a portion of the metal layer spanning the separation between the first and second metal trace portions, the first and second conductive trace portions forming terminals of the current sense resistor.

The present invention is better understood upon consideration of the detailed description below and the accompanying drawings.

DETAILED DESCRIPTION OF THE PREFERRED EMBODIMENTS

In accordance with the principles of the present invention, a current sense resistor is formed using a metal-over-passivation (MOP) layer formed on the passivation layer of an integrated circuit die. In this manner, the current sense resistor is integrated in the packaging of the integrated circuit die. Furthermore, forming the current sense resistor integrally with the integrated circuit die provides many advantages, including the ability to measure the temperature of the current sense resistor with great accuracy, thereby allowing for precise compensation of the temperature coefficient of the current sense resistor.

In one embodiment, the current sense resistor is formed on a current monitor integrated circuit die for performing current monitoring. In this manner, the current monitor integrated circuit can be applied to measure current in an electrical circuit without the need of providing an external sense resistor. Eliminating the external sense resistor saves printed circuit board space as well as lower cost. In the following description, the current sense resistor formed using a metal-over-passivation layer will sometimes be referred as a "MOP current sense resistor," or "MOP sense resistor." Moreover, in the following description, the MOP current sense resistor will be described as being formed on a current monitor integrated circuit die. The use of a current monitor integrated circuit die in the present description is illustrative only and is not intended to be limiting. The MOP current sense resistor of the present invention can be integrated into any integrated circuit die to realize a current sense resistor for the integrated circuit die.

Figure 1A:
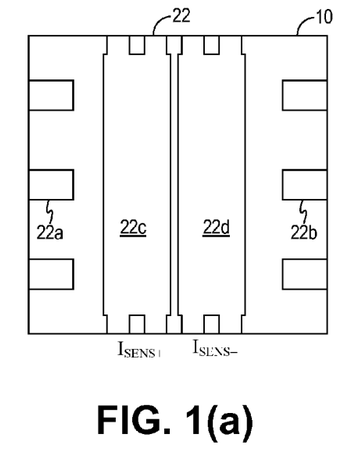
FIG. 1(a) illustrates the top view of an integrated circuit package according to one embodiment of the present invention.
Figure 1B:
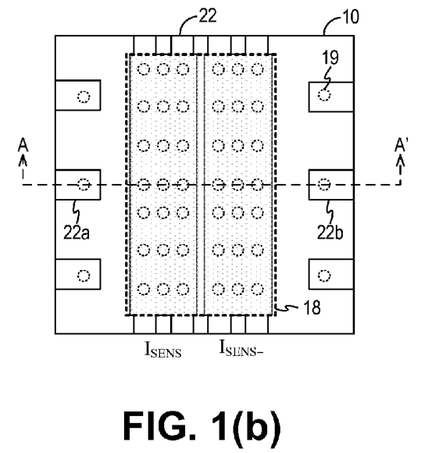
FIG. 1(b) illustrates the top view of the integrated circuit package of FIG. 1(a) with an overlying MOP current sense resistor according to one embodiment of the present invention.
Figure 1C:
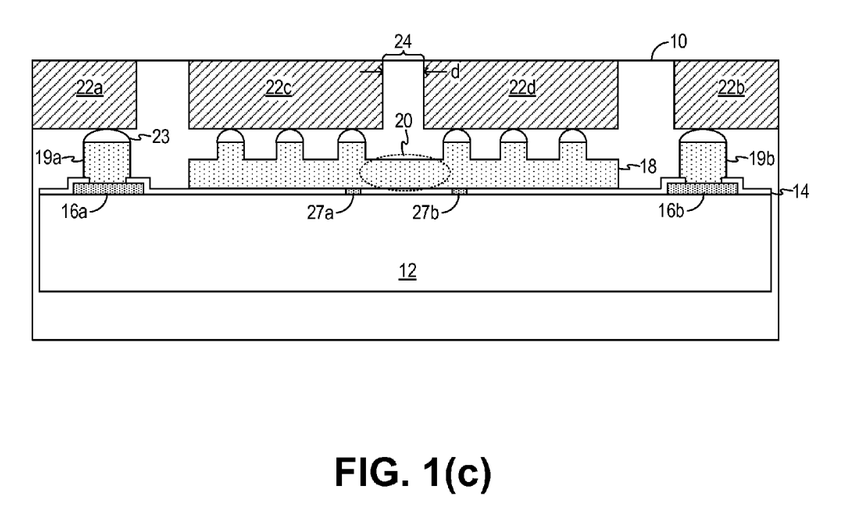
FIG. 1(c) illustrates the cross-sectional view of the integrated circuit package of FIG. 1(b) along a line A-A' according to one embodiment of the present invention.

FIG. 1(a) illustrates the top view of an integrated circuit package according to one embodiment of the present invention. FIG. 1(b) illustrates the top view of the integrated circuit package of FIG. 1(a) with an overlying MOP current sense resistor according to one embodiment of the present invention. FIG. 1(c) illustrates the cross-sectional view of the integrated circuit package of FIG. 1(b) along a line A-A' according to one embodiment of the present invention. Referring to FIGS. 1(a) to 1(c), in the present illustration, an integrated circuit die 12 is packaged in a flip-chip microleadframe (MLF) package 10. The use of a flip-chip MLF package is illustrative only. The MOP current sense resistor of the present invention can be integrated on a die in other flip-chip semiconductor packages. The exact nature of the flip-chip semiconductor package is not critical to the practice of the present invention. The die 12 has a passivation layer 14 formed thereon to protect the circuitry formed on the die 12. Openings in the passivation layer 14 are formed to expose bond pads, such as bond pads 16a and 16b, to form electrical connections from the circuitry of die 12 to external nodes.

According to embodiments of the present invention, a current sense resistor is formed in a metal-over-passivation (MOP) layer 18 formed on the passivation layer 14. The MOP layer 18 may cover substantially all or a portion of the passivation area of the integrated circuit die. In the present embodiment, the MOP layer 18 includes a blanket metal layer formed on the passivation layer 14 and an array of metal pillars extending from the blanket metal layer. In one embodiment, the MOP layer 18 is a copper layer or the MOP layer 18 can be formed using a metal alloy. In one embodiment, the MOP layer 18 is formed by electroplating.

In embodiments of the present invention, the MOP layer 18 is formed using the same process for forming a direct bump on bond pad. In one embodiment, the bump structure is a metal pillar bump structure, such as a copper pillar bump. Metal pillar bump structures are formed on bond pads of an integrated circuit die which are then used as connections to a leadframe of a semiconductor package. In a metal pillar bump process, pillar bumps are formed on the bond pads, such as bond pads 16a and 16b. The pillar bumps are then capped with a solder bump 23 and the completed metal pillar bump structure 19a and 19b can then be used to connect to the leadframe of the semiconductor package, such as to leads 22a and 22b of leadframe 22.

In accordance with embodiments of the present invention, the MOP layer 18 is formed using the same structure as metal pillar bumps 19a and 19b. More specifically, in one embodiment, the MOP layer 18 is formed as part of the metal pillar bump process for forming metal pillar bump structures 19a and 19b. In one embodiment, to form the MOP layer 18, masking is applied to the passivation layer 14 of the integrated circuit die 12 to expose the bond pads 16a and 16b and also the area where the MOP layer 18 is to be formed. Then, a metal layer is deposited over the exposed area, such as by electroplating. The metal deposition is continued until the blanket metal layer of the MOP layer 18 is formed. Then, the integrated circuit die is patterned again to define areas where the metal pillars of the MOP layer 18 are to be formed. The deposition process continues until the metal pillar bumps 19a and 19b on bond pads 16a and 16b are formed and metal pillars are formed on the blanket metal layer. Solder bumps 23 are then formed on the metal pillar bumps 19a and 19b and the metal pillars of the MOP layer 18.

After the metal pillar bumps 19a and 19b and the MOP layer 18 are formed, the integrated circuit die 12 is then flip-chip attached to a leadframe 22 of the MLF package 10. In one embodiment, the leadframe 22 is a copper leadframe. In other embodiments, the leadframe 22 can be formed using a metal alloy. Metal pillar bumps 19a and 19b are connected to leads 22a and 22b of the MLF package 10. Leads 22a and 22b form the external connections for the electrical circuits on integrated circuit die 12. In the present embodiment, leads 22a and 22b are formed as lands on the bottom of package 10 to enable surface mounting of the package to a printed circuit board.

To form the MOP current sense resistor, the metal pillars of the MOP layer 18 are connected to leadframe portions 22c and 22d. Leadframe portions 22c and 22d are electrically isolated from each other and physically separated by a separation 24 of a distance "d" located in an area around the center of the MOP layer 18. Leadframe portions 22c and 22d form the terminals Isens+ and Isens− of the MOP current sense resistor. As thus configured, leadframe portion 22c is electrically shorted to the MOP layer 18 at one end while leadframe portion 22b is electrically shorted to the MOP layer 18 at the opposite end. Accordingly, a resistor is formed in the portion of the MOP layer 18 spanning the separation of the leadframe portions 22c and 22d, denoted by the dotted circle 20. The leadframe portions 22c and 22d and the rest of the MOP layer 18 not adjacent to the separation 24 serve as a heat sink for the MOP current sense resistor and dissipate all the power for the resistor. The current sense resistor can thus handle large current flow without suffering from damages, such as that caused by electronmigration. After the integrated circuit die 12 is attached to the leadframe 20, the entire package may then be encapsulated, such as in epoxy.

Figure 2:
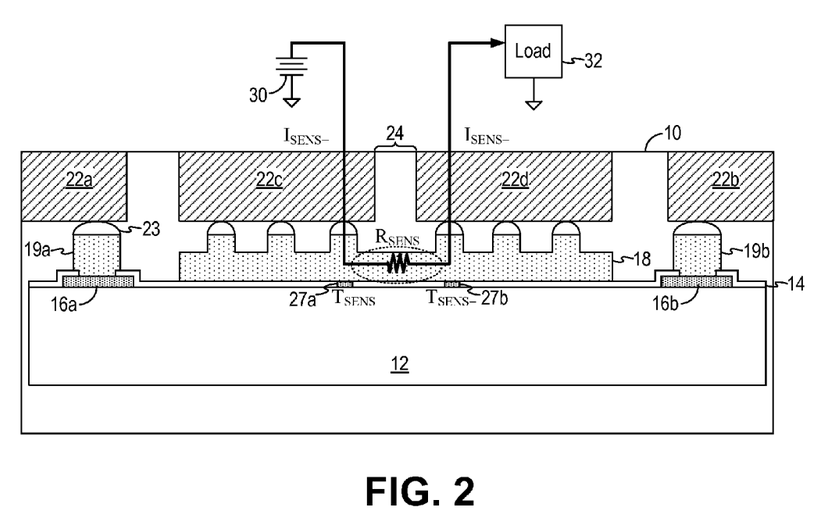
FIG. 2 repeats the cross-sectional view of FIG. 1(c) and illustrates the formation of the MOP current sense resistor in the MOP layer.

FIG. 2 repeats the cross-sectional view of FIG. 1(c) and illustrates the formation of the MOP current sense resistor in the MOP layer. Referring to FIG. 2, a current sense resistor $R_{SENS}$ is formed in the portion of the MOP layer 18 spanning the separation 24 between the leadframe portions 22c and 22d. The two terminals, Isens+ and Isens−, of the current sense resistor $R_{SENS}$ can be connected to an electrical circuit for measuring current flow. For example, in the present illustration, the current sense resistor $R_{SENS}$ is configured to measure the current flow from a power supply. Thus, the Isens+ terminal is connected to a power source 30 and the Isens− terminal is connected to a load 32 being supplied by the power source 30. Current from the power source 30 to the load 32 flows through the current sense resistor $R_{SENS}$. The voltage across the current sense resistor $R_{SENS}$ is measured to determine the current value.

Figure 3:
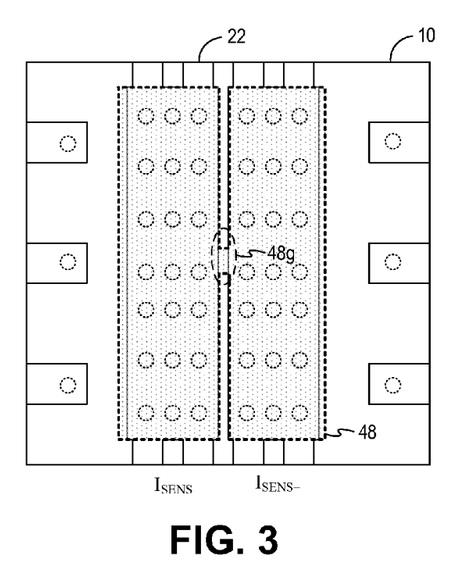
FIG. 3 is the top view of the integrated circuit package of FIG. 1(a) with an overlying MOP current sense resistor according to an alternate embodiment of the present invention.

In the embodiment shown in FIGS. 1(a) to 1(c), the current sense resistor is formed in the entire strip of MOP layer 18 spanning the separation in the leadframe portions. In other embodiments, the MOP layer may be narrowed to confine the current sense resistor to an even smaller area in the MOP layer. FIG. 3 is the top view of the integrated circuit package of FIG. 1(a) with an overlying MOP current sense resistor according to an alternate embodiment of the present invention. FIG. 3 illustrates the same flip-chip MLF package 10 of FIG. 1(a) and like elements are given like reference numerals and will not be further described. In the embodiment shown in FIG. 3, the MOP layer 48 is formed as two large MOP portions connected by a small strip 48g of MOP layer spanning the separation between the two leadframe portions. The current sense resistor is thus formed only in the small strip 48g of MOP layer between the two large MOP portions.

Figure 4:
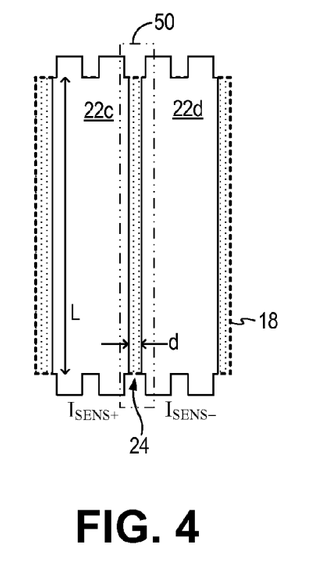
FIGS. 4 and 5 illustrate the structures of the MOP current sense resistors in the embodiments of FIG. 1(a) and FIG. 3.
Figure 5:
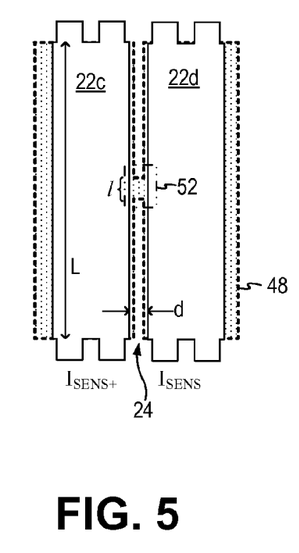

FIGS. 4 and 5 illustrate the structures of the MOP current sense resistors in the embodiments of FIG. 1(b) and FIG. 3. Referring to FIG. 4, the MOP layer 18 is formed as a contiguous metal layer, such as copper. The leadframe portions 22c and 22d are electrically shorted to the MOP layer 18 except at the separation 24. Thus, the current sense resistor is formed in the entire portion of the MOP layer 18 between the separation 24 of the leadframe portions, as denoted by the dot-dot-dash box 50. Referring to FIG. 5, in some embodiments, the MOP layer 18 at the separation 24 may be shortened to increase the resistance of the current sense resistor. In the embodiment shown in FIGS. 3 and 5, the MOP layer 48 includes two large portions connected by a small strip of MOP layer spanning the separation 24 of the leadframe portions. The leadframe portions 22c and 22d are electrically shorted to the MOP layer 48 except at the separation 24 and the current sense resistor is formed in the strip of the MOP layer 48 between the separation 24 of the leadframe portions, as denoted by the dot-dot-dash box 52. The strip of MOP layer has a length/which may be very small or may be larger and up to the entire length L of the leadframe portions.

As thus formed, the resistance of MOP current sense resistor is determined by the width of the MOP layer spanning the separation and the distance between two adjacent metal pillars formed across the separation 24. That is, the resistance of the MOP current sense resistor can be varied by varying the distance between the metal pillar closest to the separation on leadframe portion 22c and the metal pillar closest to the separation on leadframe portion 22d. Accordingly, the positioning of the array of metal pillars closest to the separation is varied to adjust the resistance of the current sense resistor. In particular, the current sense resistor can be made to have a very small resistance value by having a small separation and positioning the metal pillars to be as close to the separation as possible. A small resistance value current sense resistor is advantageous in applications such as power supply monitoring where a current monitor can be placed at the output of the power supply to monitor current usage at the load.

Figure 6:
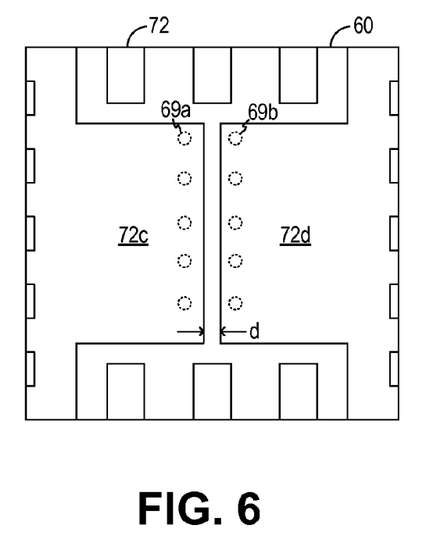
FIG. 6 illustrates the top view of an integrated circuit package according to an alternate embodiment of the present invention.

FIG. 6 illustrates the top view of an integrated circuit package according to an alternate embodiment of the present invention. FIG. 6 illustrates a semiconductor package with a different leadframe design than that of FIG. 1(a). The MOP current sense resistor can be formed using different leadframe designs as long as the leadframe includes electrically and physically isolated leadframe portions for connecting to the MOP layer. In FIG. 6, a semiconductor package 60 includes a leadframe 72 having a first leadframe portion 72c and a second leadframe portion 72d. Leadframe portions 72c and 72d are separated by a separation d. A MOP layer is to be attached to the leadframe portions 72c and 72d to form the MOP current sense resistor. As described above, the positioning of the metal pillars closest to the separation, denoted as metal pillars 69a and 69b, determines the resistance of the current sense resistor thus formed.

Figure 7:
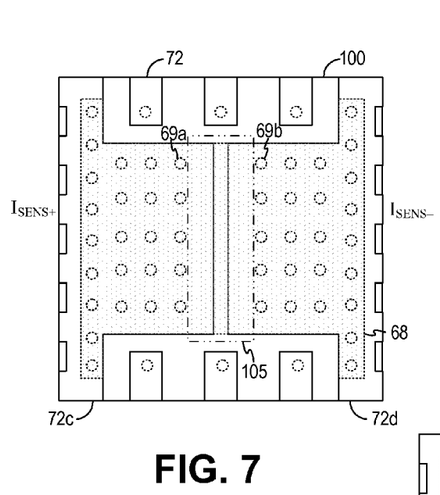
FIGS. 7 to 9 are top view of the integrated circuit package of FIG. 6 with an overlying MOP current sense resistor illustrating different embodiments of the MOP current sense resistors for realizing different resistance values.
Figure 8:
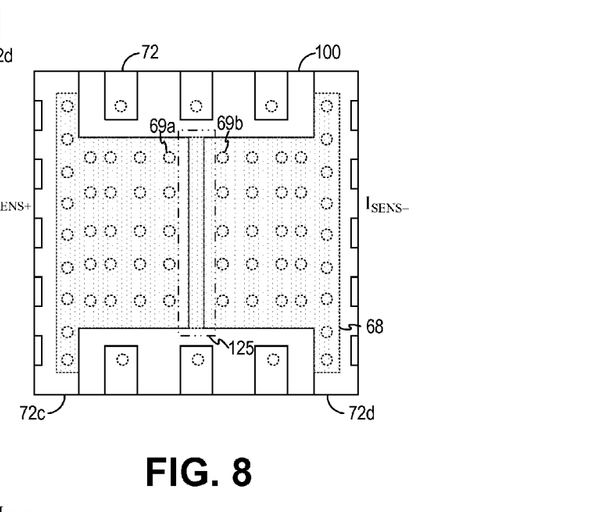
Figure 9:
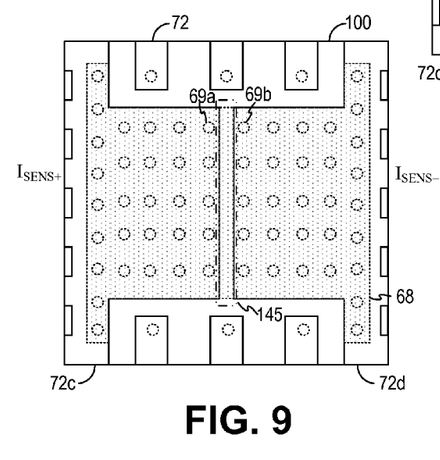

FIGS. 7 to 9 are top view of the integrated circuit package of FIG. 6 with an overlying MOP current sense resistor illustrating different embodiments of the MOP current sense resistors for realizing different resistance values. In FIGS. 7-9, a semiconductor package 100 includes a leadframe with leadframe portions 72c and 72d. An MOP layer 68 is formed on the passivation layer of an integrated circuit die which is to be attached to the leadframe 72. FIGS. 7-9 illustrate the connection of the MOP layer 68 to the leadframe portions 72c and 72d. In the embodiment shown in FIG. 7, the metal pillars 69a and 69b that are positioned closest to the separation of the leadframe portions are pull back from the separation. Thus, the portion of the MOP layer 68 in the dot-dash box 105 forms the current sense resistor. Such a current sense resistor will have a large resistance value and the current carrying capability of the sense resistor may be lower (such as 5A).

In the embodiment shown in FIG. 8, the metal pillars 69a and 69b are positioned close to but slightly pull back from the separation of the leadframe portions. Thus, the portion of the MOP layer 68 in the dot-dash box 125 forms the current sense resistor. Such a current sense resistor will have a smaller resistance value than the one in FIG. 7 and the current carrying capability of the sense resistor will be higher (such as 10A).

In the embodiment shown in FIG. 9, the metal pillars 69a and 69b are positioned very close to the separation of the leadframe portions. Thus, the portion of the MOP layer 68 in the dot-dash box 145 forms the current sense resistor. Such a current sense resistor will have an even smaller resistance value than the one in FIG. 8 and the current carrying capability of the sense resistor will be higher (such as 20A).

The MOP current sense resistor thus formed realizes many advantages.

First, the MOP current sense resistor can be formed to have a very small resistance value. The MOP current sense resistor thus heats up less and dissipates less power in operation. Furthermore, the MOP layer outside of the separation area and the leadframe/conductive trace portions serve as heat sink to dissipate heat.

Second, because the current sense resistor is formed integrally with the integrated circuit die, the temperature of the current sense resistor can be sensed faster and more accurately because the measurement is more thermally responsive as there is less thermal mass. When the temperature of the current sense resistor can be measured accurately, the temperature coefficient of the sense resistor can be properly compensated so that more accurate current measurements can be obtained.

With the MOP current sense resistor thus formed on the passivation layer of an integrated circuit die, the temperature of the MOP current sense resistor can be measured using various temperature sensing techniques. In one embodiment, referring to FIG. 1(c), contact electrodes 27a and 27b are provided to contact the MOP layer 18 for temperature measurement.

Third, the MOP current sense resistor of the present invention realize particular advantages in allowing the temperature of the resistor to be sensed very accurately. More specifically, the MOP current sense resistor reduces or eliminates the Seebeck effect so that highly accurate temperature measurements can be made. The Seebeck effect refers to the voltage that is generated at the junction of two dissimilar metals as a function of temperature. The junction between two dissimilar metals is also referred to as a Seebeck junction. When the sense resistor is external to the current monitor integrated circuit, accurate temperature measurement of the sense resistor is difficult because of the existence of many Seebeck junctions between the external resistor and the measurement point, e.g. between the sense resistor and the PC board and between the traces on the PC board. The existence of multiple Seebeck junctions introduces voltage mismatches, as each junction will generate its own voltage value. Multiple Seebeck junctions lead to inaccurate temperature measurements, as the Seebeck voltages at the two terminals of the sense resistor cannot cancel out. Furthermore, an external resistor is typically large, such as 10 mm. Therefore, a temperature gradient may exist between the two leads of the resistor, leading to further measurement inaccuracies.

However, in the MOP current sense resistor of the present invention, voltage mismatch or error due to the Seebeck effect is minimized or eliminated. First, because the sense resistor has a very small physical dimension, there is either no temperature gradient or minimal temperature gradient across the resistor, therefore the Seebeck voltages generated at the two measurement electrodes of the sense resistor will be well matched. Furthermore, the MOP current sense resistor, being formed on the passivation layer of the integrated circuit, can be measured without multiple intervening Seebeck junctions.

That is, measurement of the temperature of the MOP current sense resistor by the underlying integrated circuit involves only two Seebeck junctions and the two Seebeck junctions are close together because the size of the sense resistor is small. All other Seebeck junctions, such as at the sense terminals Isens+ and Isens−, are external to the integrated circuit package. Therefore, very accurate temperature measurement of the MOP current sense resistor can be made due to the close proximity of the Seebeck junctions of the measurement electrodes.

The MOP current sense resistor of the present invention is capable of providing a very small resistance value and also enable very accurate temperature measurements. The MOP current sense resistor of the present invention enables accurate current measurements not achievable by conventional sense resistors.

According to another aspect of the present invention, a current sense resistor is formed using a MOP layer on the passivation layer of an integrated circuit die where the integrated circuit die is packaged in a chip-scale package. A chip-scale package encapsulates the integrated circuit die with pads or balls are formed for making the external connections. The chip-scale package is almost chip-size, such as 1.2 times the die size and the chip-scale package is usually directly surface mounted to a printed circuit board.

Figure 10:
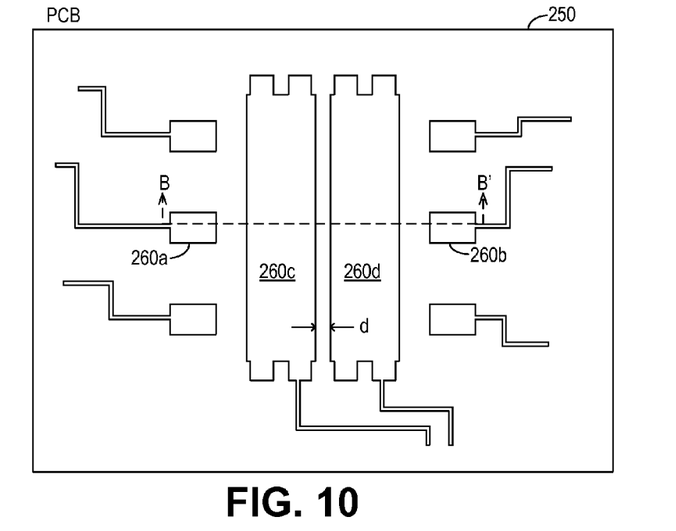
FIG. 10 is a top view of a printed circuit board for receiving a chip-scale package having an integrated circuit die and a MOP current sense resistor formed thereon according to one embodiment of the present invention.
Figure 11:
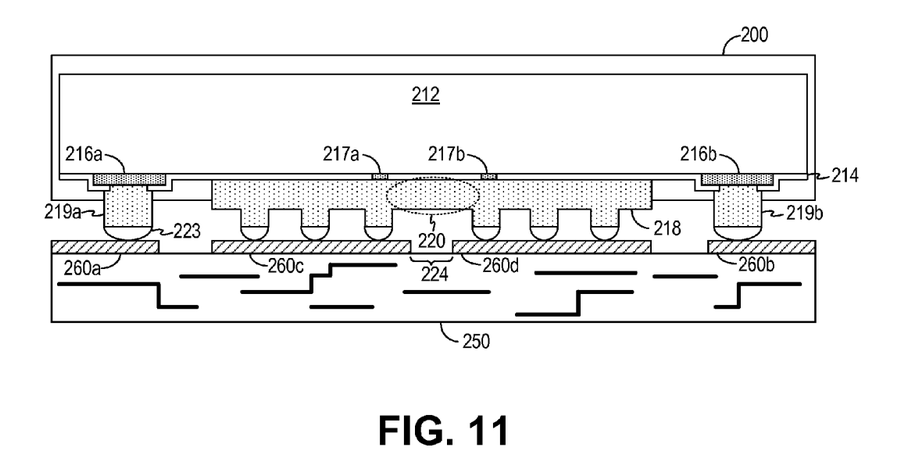
FIG. 11 is a cross-sectional view of the printed circuit board with the chip-scale package attached thereto along a line B-B'.

FIG. 10 is a top view of a printed circuit board for receiving a chip-scale package having an integrated circuit die and a MOP current sense resistor formed thereon according to one embodiment of the present invention. FIG. 11 is a cross-sectional view of the printed circuit board with the chip-scale package attached thereto along a line B-B'. Referring to FIGS. 10 and 11, a printed circuit board (PCB) 250 may be a single layer or a multi-layer PCB. The PCB 250 has conductive traces printed thereon for receiving a semiconductor package. In the present illustration, the PCB 250 has conductive traces, such as traces 260a, 260b, confirming to the package pads of the chip-scale package 200. The PCB 250 also has a first conductive trace portion 260c and a second conductive trace portion 260d formed thereon. The first conductive trace portion 260c and the second conductive trace portion 260d are formed adjacent to each other but physically separated by a separation 224 and electrically isolated from each other.

When the chip-scale package 200 is surface mounted onto the PCB 250, the MOP layer 218 formed on the passivation layer 214 of the semiconductor die 212 is electrically connected to the conductive trace portions. More specifically, a portion of the metal pillars of the MOP layer 218 is electrically connected to the first conductive trace portion 260c while other portion of the metal pillars of the MOP layer 218 is electrically connected to the second conductive trace portion 260d. As thus configured, a current sense resistor is formed in the portion of the MOP layer 218 spanning the separation of the conductive trace portions 260c and 260d, denoted by the dotted circle 220. The conductive trace portions 260c and 260d and the rest of the MOP layer 218 not adjacent to the separation 224 serve as a heat sink for the MOP current sense resistor and dissipate all the power for the resistor. The current sense resistor can thus handle large current flow without suffering from damages.

In this manner, the current sense resistor is integrated in a chip-scale package of an integrated circuit die. When the chip-scale package is surface mounted onto a PCB board, the current sense resistor is integrally formed inside the chip-scale package. The MOP current sense resistor thus formed realizes the same advantages of the MOP current sense resistor in a flip-chip semiconductor package described above.

The MOP layer 218 formed in a chip scale package can be configured in the same manner as described above in reference to FIGS. 1-9. That is, the MOP layer may be a blanket metal layer with metal pillars, as in FIG. 1(b) or the MOP layer can include two portions connected by a narrow strip, as in FIG. 3. The MOP current sense resistor can be formed with a resistance value determined by the placement of the metal pillars relative to the separation in the conductive trace portions.

The above detailed descriptions are provided to illustrate specific embodiments of the present invention and are not intended to be limiting. Numerous modifications and variations within the scope of the present invention are possible. The present invention is defined by the appended claims.

I claim:

1. A current sense resistor integrated with an integrated circuit die, the integrated circuit die being housed in a chip-scale semiconductor package, the current sense resistor comprising:
    a metal layer formed over a passivation layer of the integrated circuit die, the metal layer having an array of metal pillars extending therefrom, the metal pillars to be electrically connected to a first conductive trace portion and a second conductive trace portion formed on a printed circuit board where the first conductive trace portion and the second conductive trace portion are electrically isolated from each other and physically separated by a separation of a first distance,
    wherein the current sense resistor is formed in a portion of the metal layer spanning the separation between the first and second conductive trace portions, the first and second conductive trace portions forming terminals of the current sense resistor.

2. The current sense resistor of claim 1, wherein the separation has a distance d between the first conductive trace portion and the second conductive trace portion and a length L.

3. The current sense resistor of claim 2, wherein the portion of the metal layer forming the current sense resistor has a length equal to or less than the length L.

4. The current sense resistor of claim 1, wherein the metal layer comprises copper.

5. The current sense resistor of claim 1, wherein the metal layer comprises a metal alloy.

6. The current sense resistor of claim 1, further comprising a first contact electrode and a second contact electrode formed in the passivation layer of the integrated circuit die and electrically connected to the metal layer, the first and second contact electrodes being configured to measure a temperature of the current sense resistor.

7. The current sense resistor of claim 1, wherein the metal layer includes a first metal pillar formed closest to the separation and to be electrically connected to the first conductive trace portion and a second metal pillar formed closest to the separation and to be electrically connected to the second conductive trace portion.

8. The current sense resistor of claim 7, wherein the current sense resistor has a resistance value determined by the distance between the first metal pillar and the second metal pillar.

9. The current sense resistor of claim 8, wherein the positioning of the first and second metal pillars relative to the separation is varied to vary the resistance value of the current sense resistor.

10. The current sense resistor of claim 8, wherein the first and second metal pillars are positioned in close proximity to the separation to form a current sense resistor having a small resistance value.

11. The current sense resistor of claim 8, wherein the first and second metal pillars are positioned away from the separation to form a current sense resistor having a large resistance value.

12. The current sense resistor of claim 1, wherein the integrated circuit die comprises a current monitor integrated circuit die and wherein the first conductive trace portion is electrically connected to a first current sense terminal and the second conductive trace portion is electrically connected to a second current sense terminal of the current monitor integrated circuit die.

* * * * *